(12) United States Patent
Hashimoto et al.

(10) Patent No.: US 8,664,716 B2
(45) Date of Patent: Mar. 4, 2014

(54) SEMICONDUCTOR DEVICE, METHOD OF MANUFACTURING THE SAME AND POWER-SUPPLY DEVICE USING THE SAME

(75) Inventors: Takayuki Hashimoto, Tokai (JP); Takashi Hirao, Hitachinaka (JP); Noboru Akiyama, Hitachinaka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/818,485

(22) Filed: Jun. 18, 2010

(65) Prior Publication Data
US 2010/0327348 A1    Dec. 30, 2010

(30) Foreign Application Priority Data
Jun. 24, 2009    (JP) ................. 2009-149783

(51) Int. Cl.
*H01L 27/06*    (2006.01)
(52) U.S. Cl.
USPC ............ 257/337; 257/E29.256; 257/E21.616; 257/E21.016; 438/238
(58) Field of Classification Search
USPC .................. 257/773, 337, 339, 342, E21.616, 257/E21.016; 438/238
See application file for complete search history.

(56) References Cited

U.S. PATENT DOCUMENTS

| 5,981,996 | A | 11/1999 | Fujishima |
| 6,174,773 | B1 | 1/2001 | Fujishima |
| 6,258,680 | B1 * | 7/2001 | Fulford et al. ............... 438/305 |
| 6,545,316 | B1 * | 4/2003 | Baliga ........................ 257/329 |
| 6,972,471 | B2 * | 12/2005 | Yang et al. .................. 257/506 |
| 7,829,947 | B2 * | 11/2010 | Hebert ........................ 257/343 |
| 7,851,314 | B2 * | 12/2010 | Mallikarjunaswamy et al. ........................ 438/286 |
| 7,893,488 | B2 * | 2/2011 | Hebert ........................ 257/330 |
| 2002/0179945 | A1 | 12/2002 | Sakamoto et al. |
| 2005/0029584 | A1 | 2/2005 | Shiraishi et al. |

(Continued)

FOREIGN PATENT DOCUMENTS

| JP | 6-232396 | 8/1994 |
| JP | 8222735 | 8/1996 |

(Continued)

OTHER PUBLICATIONS

J. Ng et al., "A Novel Planar Power MOSFET with Laterally Uniform Body and Ion-Implanted JFET Region", IEEE Electron Device Letter, 2008, vol. 29, No. 4, pp. 375-377, Apr. 2008.

(Continued)

*Primary Examiner* — Stephen W Smoot
*Assistant Examiner* — Edward Chin
(74) *Attorney, Agent, or Firm* — Brundidge & Stanger, P.C.

(57) ABSTRACT

In a lateral-type power MOSFET, high breakdown voltage is achieved with suppressing to increase a cell pitch, and a feedback capacity and an ON resistance are decreased. An n$^-$ type silicon region having a high resistance to be a region of maintaining a breakdown voltage is vertically provided with respect to a main surface of an n$^+$ type silicon substrate, and the n$^-$ type silicon region having the high resistance is connected to the n$^+$ type silicon substrate. Also, a conductive substance is filled through an insulating substance inside a trench formed to reach the n$^+$ type silicon substrate from the main surface of the n$^+$ type silicon substrate so as to contact with the n$^-$ type silicon region having the high resistance, and the conductive substance is electrically connected to a source electrode.

6 Claims, 11 Drawing Sheets

(56) References Cited

U.S. PATENT DOCUMENTS

| | | |
|---|---|---|
| 2007/0120194 A1 | 5/2007 | Shiraishi et al. |
| 2008/0217684 A1 | 9/2008 | Hashimoto et al. |
| 2009/0212358 A1 | 8/2009 | Shiraishi et al. |
| 2010/0123220 A1* | 5/2010 | Burke et al. .................. 257/630 |
| 2011/0127602 A1* | 6/2011 | Mallikarjunaswamy ..... 257/331 |

FOREIGN PATENT DOCUMENTS

| | | |
|---|---|---|
| JP | 2002-368121 | 12/2002 |
| JP | 2005-57050 | 3/2005 |
| JP | 2008-218711 | 9/2008 |

OTHER PUBLICATIONS

Y. Ren et al., "Analysis of the power delivery path from the 12V VR to the microprocessor", in Proc., IEEE APEC '04, 2004, vol. 1, pp. 285-291.

M. Xu et al., "Small signal modeling of a high bandwidth voltage regulator using coupled inductor", IEEE Trans. Power Electron, vol. 22, No. 2, pp. 399-406, Mar. 2007.

* cited by examiner

SEMICONDUCTOR DEVICE, METHOD OF MANUFACTURING THE SAME AND POWER-SUPPLY DEVICE USING THE SAME

CROSS-REFERENCE TO RELATED APPLICATION

The present application claims priority from Japanese Patent Application No. 2009-149783 filed on Jun. 24, 2009, the content of which is hereby incorporated by reference into this application.

TECHNICAL FIELD OF THE INVENTION

The present invention relates to a semiconductor device, a method of manufacturing the same, and a power-supply device using the same. More particularly, the present invention relates to a technique effectively applied to a power MOSFET and a power-supply device for power conversion using the power MOSFET.

BACKGROUND OF THE INVENTION

Conventionally, a trench metal oxide semiconductor-field effect transistor (MOSFET) (disclosed in, for example, Japanese Patent Application Laid-Open Publications No. 2008-218711 (Patent Document 1) and No. 2005-57050 (Patent Document 2)) is used for a switching power-supply (hereinafter, referred to as VR: voltage regulator) of supplying power to a central processor unit (CPU) in a computer or a server. Since the trench MOSFET has a smaller cell pitch than that of a planar MOSFET (disclosed in, for example, "A Novel Planar Power MOSFET With Laterally Uniform Body and Ion-Implanted JFET Region.", IEEE Electron Device Letter, 2008, vol. 29, no. 4, pp. 375to 377, April, 2008, written by J. Ng et al., (Non-Patent Document 1)), its channel width per unit area is large, and therefore, the trench MOSFET has characteristics that ON resistance can be decreased. However, a facing area of its trench gate with its drain region is large, and therefore, the trench MOSFET has a disadvantage point of a large feedback capacity.

In recent years, the number of output capacitors of suppressing CPU-voltage variation caused when CPU consumption current is changed has been increased in order to increase a current and decrease a voltage in the CPU, which results in increasing a size and cost of the VR. It is known that improvement of a switching frequency of the VR is effective for decreasing the number of output capacitors (disclosed in, for example, "Analysis of the power delivery path from the 12-V VR to the microprocessor", in Proc., IEEE APEC' 04, 2004, vol. 1, pp. 285 to 291, written by Y. Ren et al. (Non-Patent Document 2) or "Small signal modeling of a high bandwidth voltage regulator using coupled inductor", IEEE Trans. Power Electron., vol. 22, no. 2, pp. 399 to 406, March 2007, written by M. Xu et al. (Non-Patent Document 3)).

A bottle neck in the improvement of the switching frequency is that a temperature of a MOSFET exceeds an upper limit of an operating temperature (for example, 150° C.) due to losses caused by the switching. As the losses caused in the switching, there are turn-on loss, turn-off loss, and drive loss for a high-side MOSFET of the VR, and conduction loss and recovery loss of an embedded diode and drive loss for a low-side MOSFET. Among the losses, the turn-on loss and the turn-off loss for the high-side MOSFET are relatively largely occupied. Hereinafter, the turn-on loss and the turn-off loss are collectively called a switching loss.

Decrease of the feedback capacity of the MOSFET is effective for decrease of the switching loss. This is because, as the feedback capacity becomes small, a switching speed becomes large, and therefore, the switching loss is decreased. There is a problem that a trench MOSFET essentially has a large feedback capacity, and therefore, the further improvement of the switching frequency is difficult.

Although a lateral-type MOSFET is cited as a structure capable of decreasing the feedback capacity, it has a disadvantage point of a large ON resistance. As reasons for the large ON resistance of the lateral-type MOSFET, the following two can be cited.

First, a region of maintaining a breakdown voltage is provided in a horizontal direction with respect to a surface of a semiconductor substrate, and therefore, when a high breakdown voltage is required, increase of a distance in the horizontal direction is required, and a cell pitch is increased, and as a result, the ON resistance is increased.

Second, drain and source electrodes are pulled from the substrate surface, and therefore, resistances of the electrodes, that is spreading resistances, are increased when a drain current is flown in the horizontal direction with respect to the substrate surface.

As means of solving the second problem, it is suggested that, the source electrode or the drain electrode is provided on a rear surface of the semiconductor substrate, so that a current is flown toward the rear surface of the substrate through a diffusion layer or a conductive substance such as a metal or polysilicon (disclosed in, for example, Japanese Patent Application Laid-Open Publications No. 2002-368121 (Patent Document 3) and No. H06-232396 (Patent Document 4)). By providing the source or drain electrode on the rear surface, areas of the source and drain electrodes are increased, and therefore, the spreading resistances of the electrodes can be decreased.

SUMMARY OF THE INVENTION

Although the second problem is solved by techniques of Patent Documents 3 and 4, the first problem is not solved thereby, the first problem meaning that, when the high breakdown voltage is required, the increase of the distance in the horizontal direction is required in order to provide the region of maintaining the breakdown voltage in the horizontal direction with respect to the surface of the semiconductor substrate, and the cell pitch is increased, and as a result, the ON resistance is increased.

A preferred aim of the present invention is to provide a technique in a lateral-type power MOSFET, of decreasing a feedback capacity and an ON resistance with preventing increase of an element area.

The above and other preferred aims and novel characteristics of the present invention will be apparent from the description of the present specification and the accompanying drawings.

The typical ones of the inventions disclosed in the present application will be briefly described as follows.

In a semiconductor device according to an invention of the present application including a power MOSFET formed on a main surface of a first conductive type semiconductor substrate having a first resistance, the power MOSFET includes: a semiconductor region formed on the main surface of the first conductive type semiconductor substrate having the first resistance, which has a second resistance higher than the first resistance; a first conductive type semiconductor region formed on a part of a surface of the semiconductor region having the second resistance, which has a third resistance higher than the first resistance; a second conductive type semiconductor region formed on a part of a surface of the semiconductor region having the second resistance; a first conductive type semiconductor region formed on a part of a surface of the second conductive type semiconductor region, which has a fourth resistance lower than the third resistance; a gate electrode formed on a main surface of the semiconductor region having the second resistance through a gate insulating film; a source electrode formed on the main surface of the semiconductor region having the second resistance so as to interpose the gate insulating film between itself and the gate electrode, which is electrically connected to the first conductive type semiconductor region having the fourth resistance; and a drain electrode formed on a rear surface of the first conductive type semiconductor substrate having the first resistance. The first conductive type semiconductor region having the third resistance is provided from the main surface of the semiconductor region having the second resistance to the first conductive type semiconductor substrate having the first resistance, a trench is formed from the main surface of the semiconductor region having the second resistance to the first conductive type semiconductor substrate having the first resistance so as to contact with the first conductive type semiconductor region having the third resistance, a conductive substance is filled inside the trench through an insulating substance, and the conductive substance is electrically connected to the source electrode.

The effects obtained by typical aspects of the present invention will be briefly described below.

In a lateral-type power MOSFET, there is provided a technique capable of decreasing a feedback capacity and an ON resistance with preventing increase of an element area.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, when "formed of A" or "formed by A" is described for components or the like in embodiments, it goes without saying that other components are not eliminated unless otherwise specified to be only the component.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, when materials and others are mentioned, specified one is a main material unless otherwise stated not to be so or it is principally or apparently not so, and subsidiary components, additives, additional components, and others are not eliminated. For example, a silicon material includes not only pure silicon but also binary or ternary alloy (for example, SiGe) having additive impurities and silicon as a main component or others unless otherwise stated.

Also, components having the same function are denoted by the same reference symbols throughout the drawings for describing the embodiments, and the repetitive description thereof is omitted.

Also, in some drawings used in the embodiments, hatching is partially used even in a plan view so as to make the drawings easy to see.

(First Embodiment)

Figure 1:
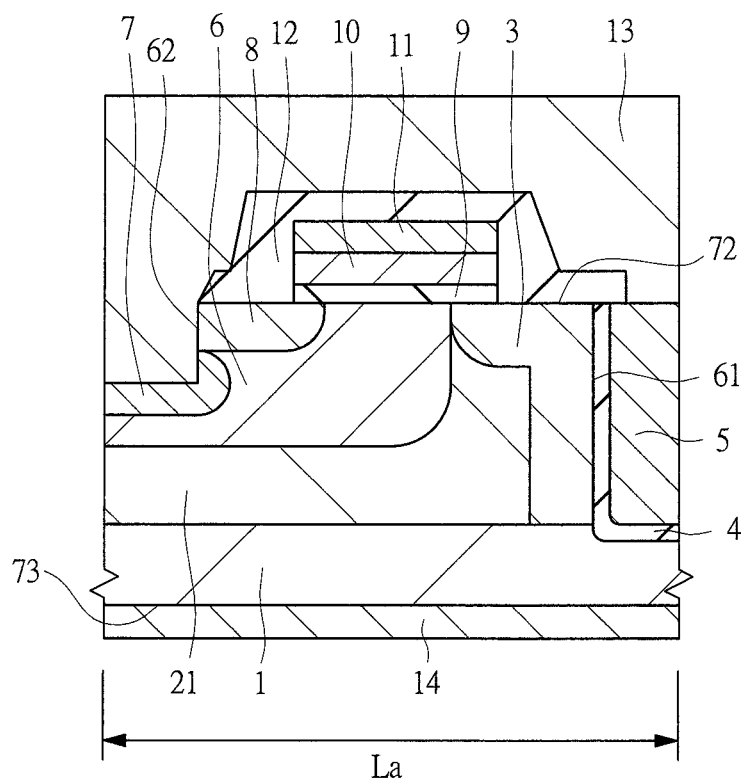
FIG. 1 is a principal cross-sectional view of a semiconductor device according to a first embodiment of the present invention.

FIG. 1 illustrates a cross-sectional view of a lateral-type power MOSFET according to a first embodiment in which the present invention is employed, and a reference symbol "1" in the figure denotes an $n^+$ type silicon substrate (semiconductor substrate), a reference symbol "21" denotes an $n^-$ type silicon region (first drift region), a reference symbol "3" denotes an $n^-$ type silicon region having a high resistance (second drift region), a reference symbol "6" denotes a p type silicon region (well region), a reference symbol "7" denotes a $p^+$ type silicon region (well/contact region), a reference symbol "8" denotes an $n^+$ type silicon region (source region), a reference symbol "9" denotes a gate insulating film, a reference symbol "10" denotes a gate electrode, a reference symbol "11" denotes a conductive film having a low resistance such as silicide, a reference symbol "12" denotes an insulating film, a reference symbol "13" denotes a source electrode, and a reference symbol "14" denotes a drain electrode. A trench 61 is provided adjacent to the $n^-$ type silicon region 3, an inside of the trench 61 is filled by the conductive substance 5 through the insulating substance 4, and the conductive substance 5 is electrically connected to the source electrode 13.

Here, a semiconductor-substrate surface on which the $n^+$ type silicon region 8 of the source and the p type silicon region 6 of the well are provided is referred to as a main surface 72 (first main surface), and a rear surface of the $n^+$ type silicon substrate 1 is referred to as a rear surface 73 (second main surface) of the semiconductor substrate.

The $n^-$ type silicon region 21 is previously formed on the surface of the $n^+$ type silicon substrate 1 by, for example, an epitaxial growth method or others, and the $n^-$ type silicon region 3 and the p type silicon region 6 are formed on a surface of the $n^-$ type silicon region 21 by ion implantation and diffusion processes. Details of the manufacturing processes will be described later.

In a lateral-type power MOSFET described in the present embodiment, among each component described above, more particularly, main three terminals of the drain, source, and gate have the following structures. The $n^-$ type silicon region 21 and the $n^-$ type silicon region 3 forms the drain, and are connected to the drain electrode 14 through the $n^+$ type silicon substrate 1 adjacent to the $n^-$ type silicon region 21 and the $n^-$ type silicon region 3. The $n^+$ type silicon region 8 forms the source, and is connected to the source electrode 13. The gate electrode 10 separated by the gate insulating film 9 forms the gate on a surface of the p type silicon region 6. The p type silicon region 6 forms the well region.

When a positive voltage is applied to the gate electrode 10, electric field is generated in the p type silicon region 6 through the gate insulating film 9. A strength of the electric field is particularly large at a junction surface with the gate insulating film 9 in the p type silicon region 6, and therefore, the joint surface is inverted to an n type, so that carriers are generated. At this time, if a voltage is applied between the source electrode 13 and the drain electrode 14, carrier drift is caused through the $n^+$ type silicon region 8 of the source and the $n^-$ type silicon region 3 of the drain.

Also, a trench 62 is provided from the substrate surface to the p type silicon region 6 for providing electrical contact with the p type silicon region 6, so that the p type silicon region 6 is integrally conducted with the $n^+$ type silicon region 8 of the source. At this time, for providing Ohmic contact, the $p^+$ type silicon region 7 is formed in a contact surface between the source electrode 13 and the p type silicon region 6.

Although the drain electrode 14 is provided so as to contact with the rear surface 73 in the present embodiment, both of the drain and source electrodes of the lateral-type MOSFET are generally provided on the main surface of the semiconductor substrate, and therefore, the MOSFET is called "lateral type". Meanwhile, in the trench MOSFETs in Patent Documents 1 and 2, the drain electrode is provided on the rear surface of the semiconductor substrate, and therefore, the MOSFETs are called a vertical-type MOSFET.

In the lateral-type power MOSFET described in the present embodiment, a power MOSFET illustrated in FIG. 1 is a basic unit, and is called a unit cell. Practically, there is provided a structure having a plurality of unit cells each repeatedly arranged as a basic unit. A dimension of the unit cell in a lateral direction is called a cell pitch "La", and the number of unit cells forming on a unit area is large as the cell pitch La is small, so that the ON resistance can be decreased.

Also, the $n^-$ type silicon region 3 contacts with the conductive substance 5 through the insulating substance 4, so that an impurity concentration of the $n^-$ type silicon region 3 can be increased, and a resistance of the $n^-$ type silicon region 3 can be decreased. It is known as "RESURF effect" that a resistance of an $n^-$ type silicon region is decreased by providing a conductive substance electrically connected with a source electrode so as to be adjacent to an $n^-$ type silicon region through an insulating material (disclosed in, for example, "Split-gate RESURF stepped oxide (RSO) MOSFET for 25 V applications with record low gate-to-drain charge" in Proc. IEEE ISPSD' 07, May 2007, pp. 61 to 64, written by P. Goarin et al.).

Next, with reference to FIGS. 2 to 12, a method of manufacturing the semiconductor device according to the first embodiment of the present invention is described.

Figure 2:
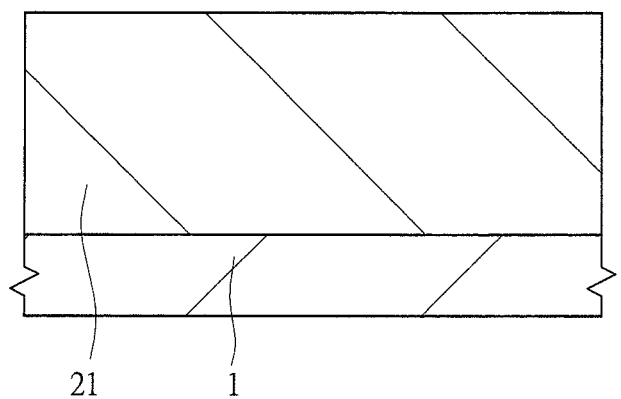
FIG. 2 is a principal cross-sectional view illustrating a method of manufacturing the semiconductor device according to the first embodiment of the present invention.

First, as illustrated in FIG. 2, the $n^-$ type silicon region 21 is formed on the $n^+$ type silicon substrate 1 by an epitaxial growth method.

Figure 3:
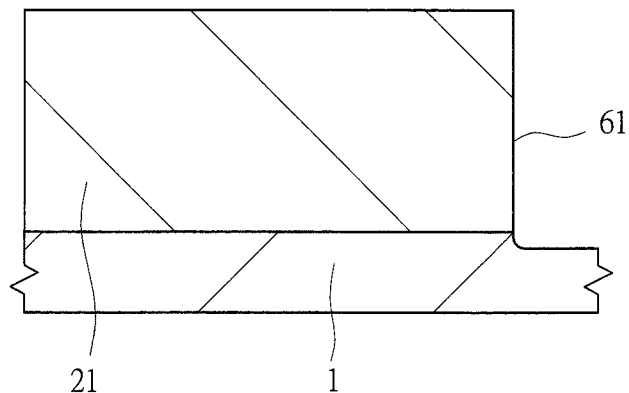
FIG. 3 is a principal cross-sectional view illustrating the method of manufacturing the semiconductor device continued from FIG. 2.

Next, as illustrated in FIG. 3, the region is patterned with using a photomask, and then, the trench 61 is formed by dry etching.

Figure 4:
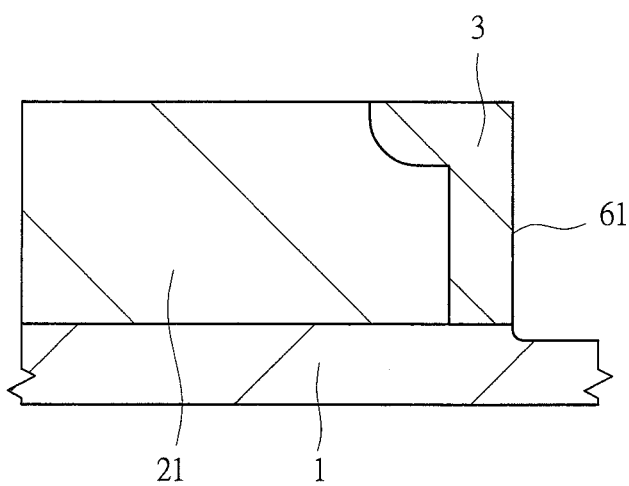
FIG. 4 is a principal cross-sectional view illustrating the method of manufacturing the semiconductor device continued from FIG. 3.

Next, as illustrated in FIG. 4, the region is patterned with using a photomask, and then, the $n^-$ type silicon region 3 is formed by ion implantation. At this time, an angle of the ion implantation is sifted from a vertical direction with respect to the substrate surface, so that the $n^-$ type silicon region 3 is formed on a side surface of the trench 61.

Figure 5:
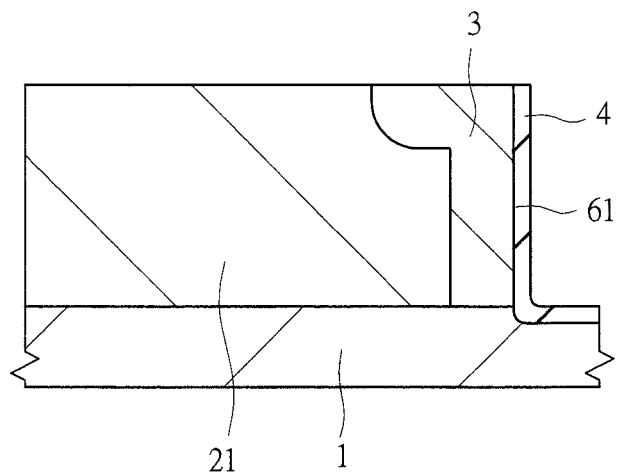
FIG. 5 is a principal cross-sectional view illustrating the method of manufacturing the semiconductor device continued from FIG. 4.

Next, as illustrated in FIG. 5, an insulating substance 4 made of silicon dioxide is formed inside the trench 61 by thermal diffusion. Note that BST ((Ba, Sr) TiO$_3$) may be used as a material of the insulating substance 4.

Figure 6:
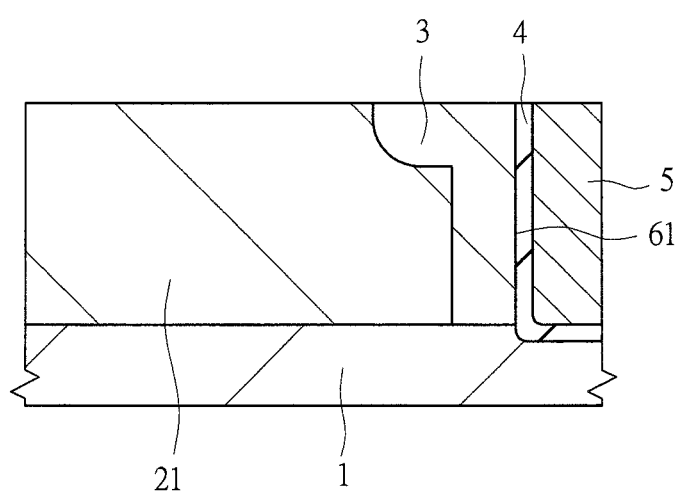
FIG. 6 is a principal cross-sectional view illustrating the method of manufacturing the semiconductor device continued from FIG. 5.

Next, as illustrated in FIG. 6, polysilicon is deposited by a chemical vapor deposition (CVD) method, and polysilicon deposited on a portion except inside the trench 61 is removed by etch back, so that the conductive substance 5 is formed.

Figure 7:
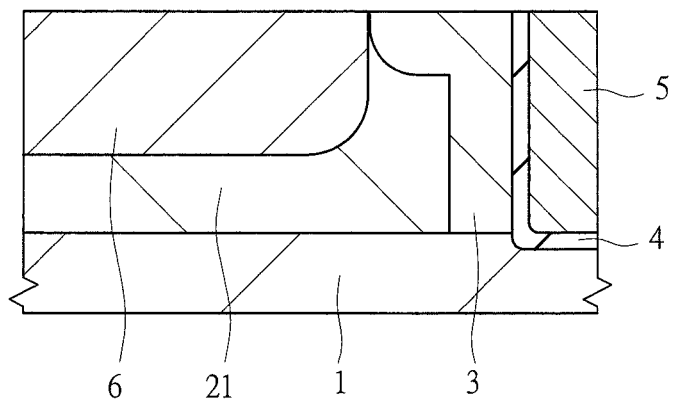
FIG. 7 is a principal cross-sectional view illustrating the method of manufacturing the semiconductor device continued from FIG. 6.

Next, as illustrated in FIG. 7, the region is patterned with using a photomask, and then, the p type silicon region 6 is formed by ion implantation.

Figure 8:
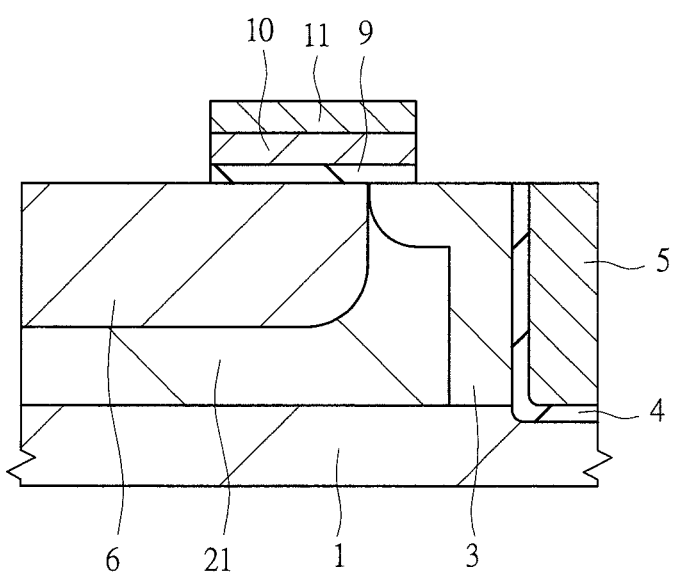
FIG. 8 is a principal cross-sectional view illustrating the method of manufacturing the semiconductor device continued from FIG. 7.

Next, as illustrated in FIG. 8, silicon dioxide to be the gate insulating film 9 is formed by thermal oxidation, and then, polysilicon to be the gate electrode 10 and silicide to be the conductive film 11 are deposited by a CVD method, and are patterned with using a photomask, and then, the insulating film 9, the gate electrode 10, and the conductive film 11 are formed by dry etching.

Figure 9:
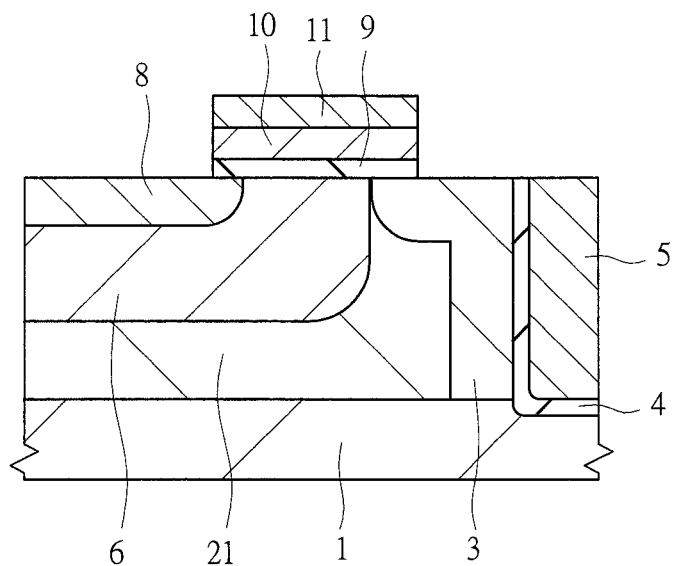
FIG. 9 is a principal cross-sectional view illustrating the method of manufacturing the semiconductor device continued from FIG. 8.

Next, as illustrated in FIG. 9, the region is patterned with using a photomask, and then, the n+ type silicon region 8 to be the source is formed by ion implantation.

Figure 10:
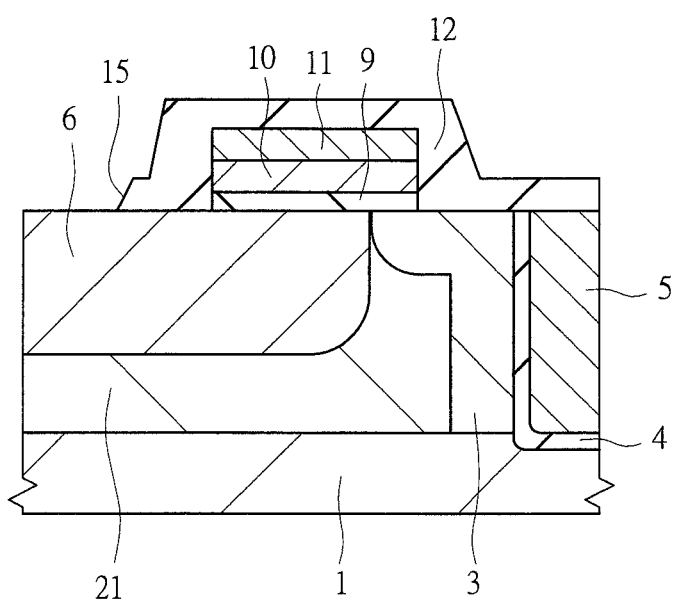
FIG. 10 is a principal cross-sectional view illustrating the method of manufacturing the semiconductor device continued from FIG. 9.

Next, as illustrated in FIG. 10, silicon dioxide to be the insulating film 12 is deposited by a CVD method and is patterned with using a photomask, and then, a contact hole 15 is formed in the insulating film 12 for providing the contact with the source electrode.

Figure 11:
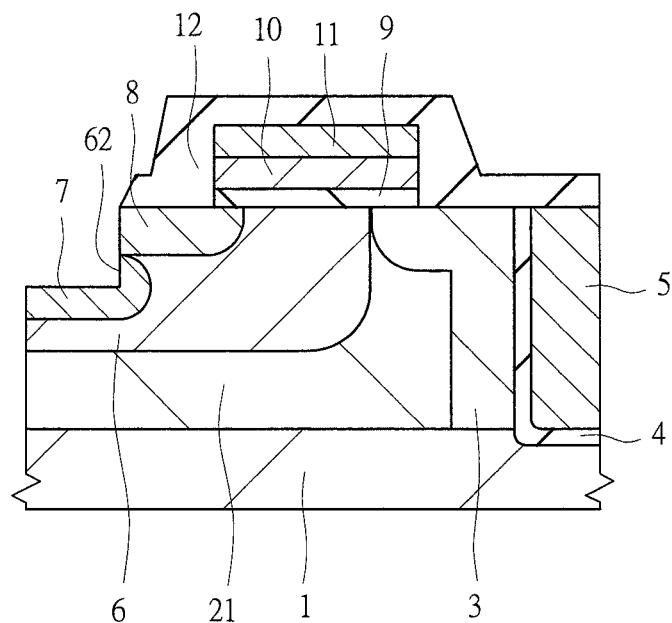
FIG. 11 is a principal cross-sectional view illustrating the method of manufacturing the semiconductor device continued from FIG. 10.

Next, as illustrated in FIG. 11, the trench 62 is formed in the p type silicon region 6 by dry etching, and then, the p+ type silicon region 7 is formed on a bottom portion of the trench 62 by ion implantation for providing the Ohmic contact between the p type silicon region 6 and the source electrode.

Figure 12:
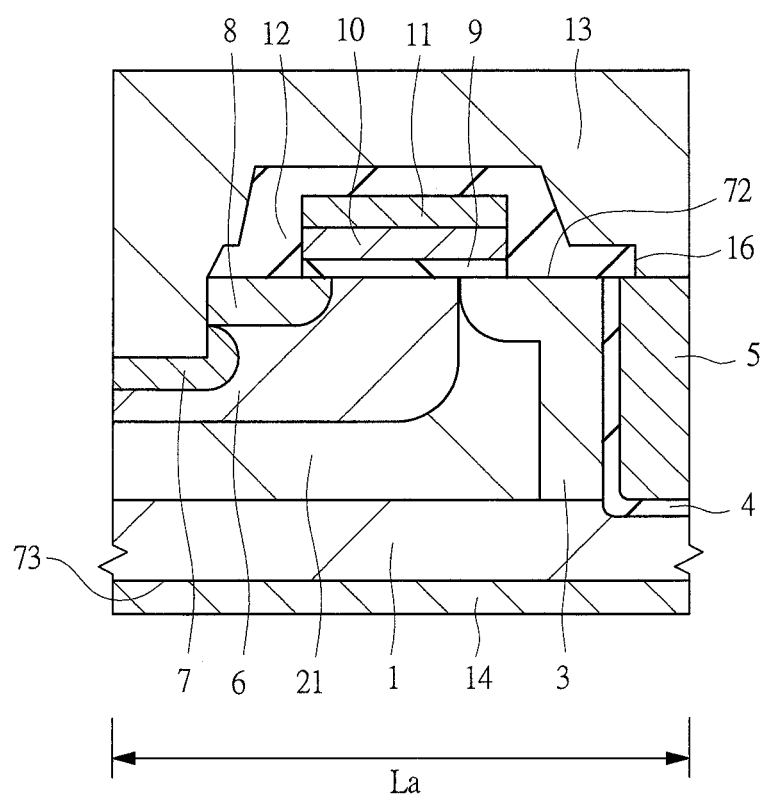
FIG. 12 is a principal cross-sectional view illustrating the method of manufacturing the semiconductor device continued from FIG. 11.

Next, as illustrated in FIG. 12, the region is patterned with using a photomask, and then, a contact hole 16 for connecting between the polysilicon of the conductive substance 5 and the source electrode is formed by dry etching. Last, the source electrode 13 and drain electrode 14 are deposited on the main and rear surfaces of the n+ type silicon substrate 1 by a CVD method, respectively, so that the semiconductor device according to the present embodiment is completed. Here, as materials of the source electrode 13 and drain electrode 14, "Al" (aluminum) is mainly used.

A different point of the present embodiment from conventional examples (in Patent Documents 3 and 4) is that the region (n− type silicon region 3) of maintaining the breakdown voltage called the drift region is vertically provided with respect to the main surface 72 of the semiconductor substrate. Also in the conventional examples (in Patent Documents 3 and 4), the drain electrode is provided so as to contact with the rear surface 73. However, since a path of currents flowing from the main surface 72 to the rear surface 73 in the vertical direction is formed of a conductive substance such as polysilicon and a metal, the breakdown voltage cannot be maintained in the vertical direction, and therefore, the breakdown voltage of the MOSFET is determined by a dimension of the n type silicon region 3 in the lateral direction (horizontal direction with respect to the main surface 72). Accordingly, it is required to increase the dimension in the lateral direction for increasing the breakdown voltage, and therefore, there arises a problem that, the cell pitch La is widened, and as a result, the ON resistance is increased.

On the other hand, in the present embodiment, the n− type silicon region 3 to be the drift region is vertically formed with respect to the main surface 72. Accordingly, it is only required to increase the dimension in the longitudinal direction (vertical direction with respect to the main surface 72) for increasing the breakdown voltage, and therefore, the cell pitch La is not increased even in the high breakdown voltage, and as a result, the increase of the ON resistance can be suppressed.

Next, a design guide for improving avalanche capability in the present embodiment is described. The avalanche capability represents a current value at which a MOSFET is not physically broken when a voltage over a breakdown voltage is applied to the MOSFET, and the current value is called a peak avalanche current "Iap". Generally, it is known that, in the lateral-type MOSFET, the breakdown is caused in a vicinity of the main surface 72, and therefore, the avalanche capability is low. In the present embodiment, a junction breakdown between the p type silicon region 6 and the n− type silicon region 21 is designed to be lower than that between the p type silicon region 6 and the n− type silicon region 3 having the high resistance, so that the breakdown is caused in the vicinity of the junction surface between the p type silicon region 6 and the n− type silicon region 21, that is inside the semiconductor substrate, and therefore, the avalanche capability can be improved.

Note that, although the insulating substance 4 and the conductive substance 5 are formed adjacent to the n− type silicon region 21 in the present embodiment, the insulating substance 4, the conductive substance 5, and the contact hole 16 may be not provided. However, in this case, the impurity concentration of the n− type silicon region 3 cannot be increased, and therefore, the resistance of the n− type silicon region 3 cannot be decreased, and as a result, the RESURF effect cannot be obtained. As the manufacturing method, there are a method that the inside of the trench 61 is filled by an insulating material made of an insulating substance such as silicon dioxide instead of the insulating substance 4 and the conductive substance 5, a method that the trench 61 is not formed and the n− type silicon region 21 is formed by ion implantation with using a photoresist as a mask, and others.

(Second Embodiment)

Figure 13:
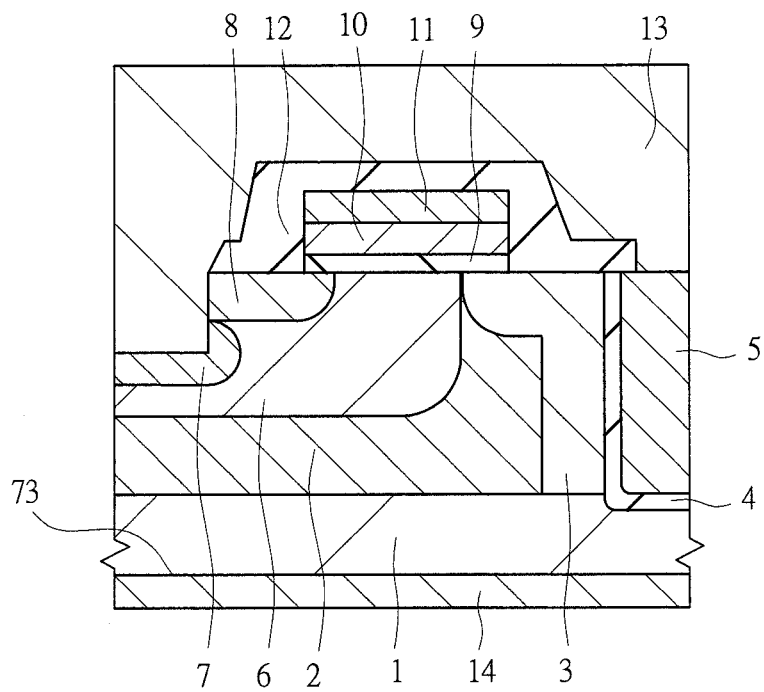
FIG. 13 is a principal cross-sectional view of a semiconductor device according to a second embodiment of the present invention.

FIG. 13 illustrates a cross-sectional view of a lateral-type power MOSFET according to a second embodiment in which the present invention is employed, and a different point from the first embodiment is that a p− type silicon region 2 is used instead of the n− type silicon region 21. By arranging the p− type silicon region 2 and the n− type silicon region 3 so as to be adjacent to each other, the impurity concentration of the n− type silicon region 3 can be increased, and the resistance of the same can be decreased. It is generally known as "super junction" that a resistance is decreased by arranging a p type region and an n type region so as to be adjacent to each other as described above (disclosed in, for example, "A new generation of high voltage MOSFETs breaks the limit line of silicon" in Technical digest IEEE IEDM' 98, December 1998, pp. 683 to 685, written by G. Deboy et al.).

Note that, also in the present embodiment, the insulating substance 4, the conductive substance 5, and the contact hole 16 may be not provided. However, in this case, the RESURF effect cannot be obtained.

(Third Embodiment)

Figure 14:
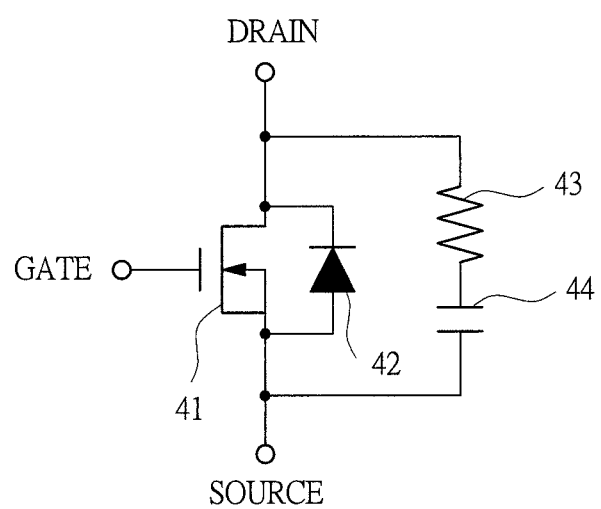
FIG. 14 is a circuit diagram of a power MOSFET in which a Snubber resistor and a Snubber capacitor are added.

Next, with reference to FIGS. 14 to 18, a third embodiment of the present invention is described. FIG. 14 is a circuit diagram in which a Snubber resistor 43 and a Snubber capacitor 44 are added to a power MOSFET 41 and an embedded diode 42. A series circuit constituted of the Snubber resistor 43 and the Snubber capacitor 44 is connected between drain and source of the power MOSFET 41, and has an effect of suppressing voltage variation caused in the MOSFET switching.

Figure 15:
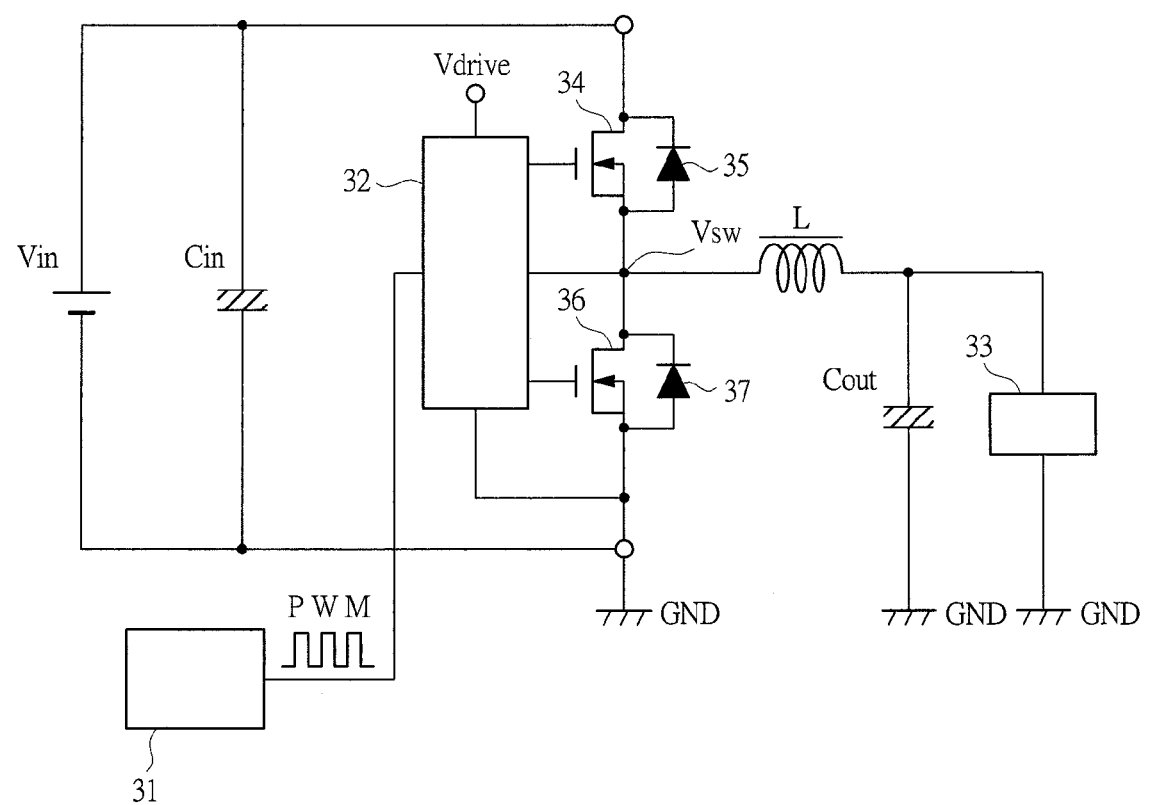
FIG. 15 is a circuit diagram of a non-isolated Buck converter.
Figure 16A:
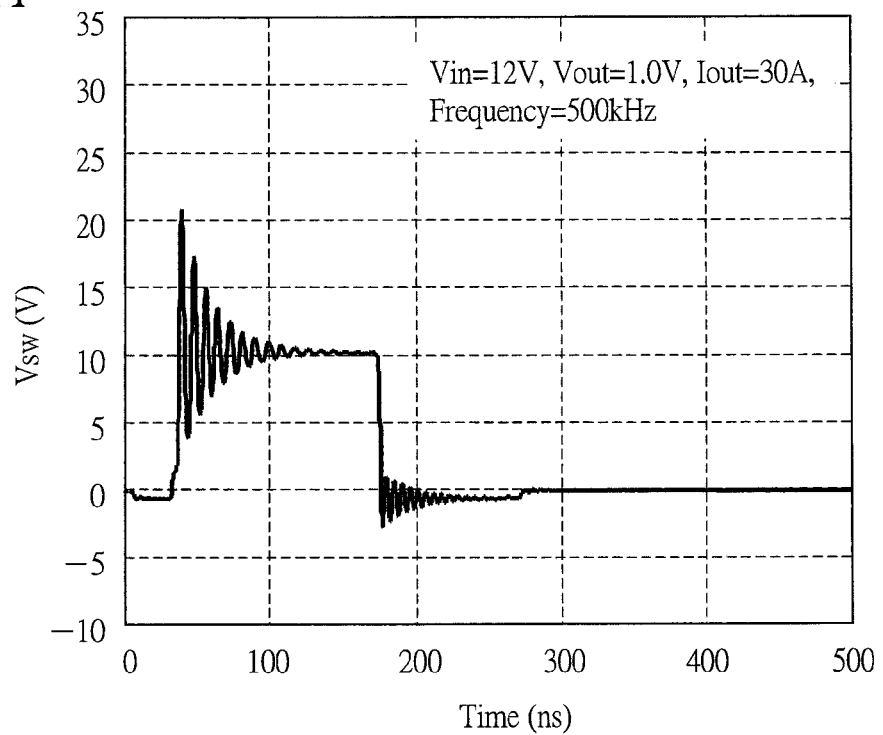
FIG. 16A is a voltage waveform in switching of a power-supply device having a Snubber resistor and a Snubber capacitor.
Figure 16B:
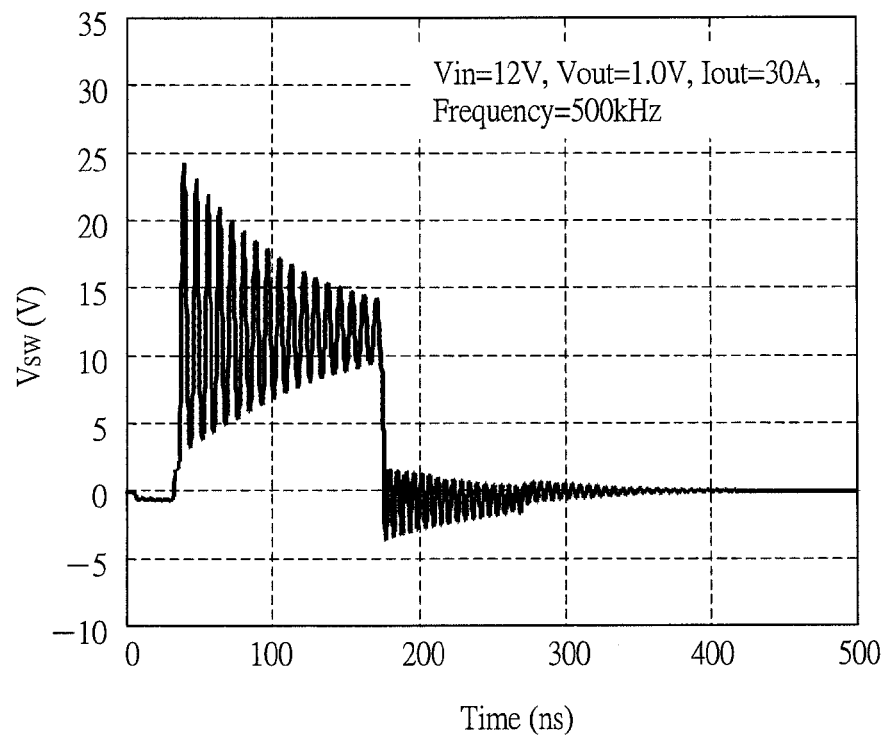
FIG. 16B is a voltage waveform in switching of a power-supply device not having the Snubber resistor and the Snubber capacitor.

FIG. 15 illustrates a configuration of a circuit used for a power supply of supplying power to a processor or others, and the circuit is called a non-isolated Buck converter. The Buck converter includes: an input power supply Vin; an input capacitor Cin; a high-side MOSFET 34; an embedded diode 35 in the high-side MOSFET 34; a low-side MOSFET 36; an embedded diode 37 in the low-side MOSFET 36; a driver 32 of driving the high-side MOSFET 34 and the low-side MOSFET 36; a power supply Vdrive for the driver 32; a power-supply controller 31 of supplying PWM signals to the driver 32; an output inductor L configuring an output filter; an output capacitor Cout; and a processor 33 to be a load. When the high-side MOSFET 34 is turned on, a drain voltage Vsw of the low-side MOSFET 36 is increased to a power-supply voltage Vin. At this time, the drain voltage Vsw of the low-side MOSFET 36 is increased to the power-supply voltage Vin or higher by influences of a parasitic inductance existing in a loop among the input capacitor Cin, the high-side MOSFET 34, and the low-side MOSFET 36, and voltage vibration is generated. In recent years, there has arisen a problem that, a driving power of a driver circuit is increased for reducing losses of the Buck converter to rapidly switch a MOSFET, and therefore, noises caused by the voltage vibration affect electrical devices. FIGS. 16A and 16B illustrate voltage waveforms of the drain voltage Vsw of the low-side MOSFET when the high-side MOSFET is turned on. A measuring point is at the Vsw in FIG. 15.

It is found out that the voltage vibration is suppressed in a case that the Snubber resistor and the Snubber capacitor are provided (in FIG. 16A) more than a case that the Snubber resistor and the Snubber capacitor are not provided (in FIG. 16B). This is because the Snubber capacitor relaxes rapid rise and down of the voltages in the switching to suppress peak voltages and the Snnuber resistor damps the voltage vibration. As described above, the Snubber resistor and the Snubber capacitor have effects of suppressing the peak voltage and the voltage vibration in the switching. However, there arises a problem that, when external capacitor and resistor are added, a cost and mounting area of the Buck converter are increased.

Figure 17A:
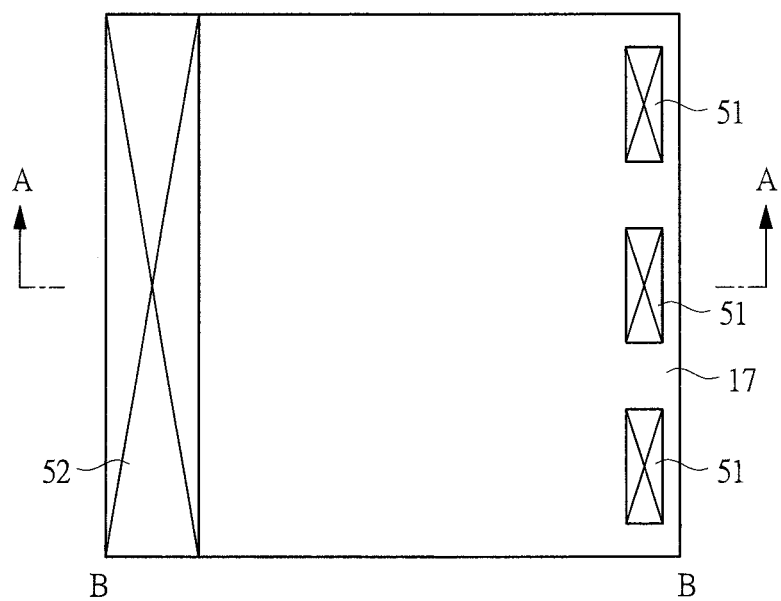
FIG. 17A is a plan view of a semiconductor device according to a third embodiment of the present invention.
Figure 17B:
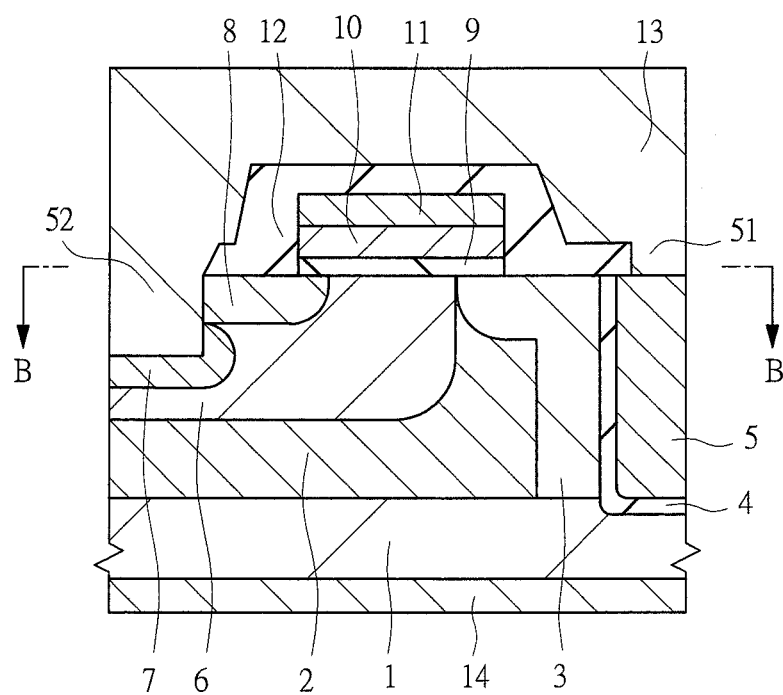
FIG. 17B is a principal cross-sectional view of the semiconductor device according to the third embodiment of the present invention.

The present embodiment provides means of configuring the Snubber resistor and the Snubber capacitor in the semiconductor substrate without adding external capacitor and resistor. FIGS. 17A and 17B are views for explaining the semiconductor device according to the present embodiment, FIG. 17A illustrates a plan view of a cross-sectional surface taken along a line B-B in FIG. 17B, and FIG. 17B illustrates a cross-sectional view taken along a line A-A in FIG. 17A. In FIG. 17A, a reference symbol "51" denotes a contact between the source electrode 13 and the conductive substance 5, a reference symbol "52" denotes a contact among the source electrode 13, the n⁺ type silicon region 8, and the p⁺ type silicon region 7, and a reference symbol "17" denotes an insulating film formed of the gate insulating film 9 and the insulating film 12 in FIG. 17B, respectively. A different point of the present embodiment from the second embodiment is that the contact 51 between the source electrode 13 and the conductive substance 5 is intermittently provided in the horizontal direction of the substrate surface.

In FIG. 17A, while the contact 52 among the source electrode 13, the n⁺ type silicon region 8, and the p⁺ type silicon region 7 is continuously provided, the contact 51 between the source electrode 13 and the conductive substance 5 is intermittently provided. In the present embodiment, the Snubber capacitor 44 is formed of a capacitor having: the insulating substance 4 as a dielectric material; and the conductive substance 5, the n⁻ type silicon region 3, and the n⁺ type silicon substrate 1 as electrodes, and the Snubber resistor 43 is formed of the conductive substance 5. For using the conductive substance 5 as the Snubber resistor 43, it is required to adjust the conductive substance 5 so as to have a desired resistance value. The resistance value of the conductive substance 5 can be adjusted by changing resistivity of the conductive substance 5 or a distance of the contact 51 between the conductive substance 5 and the source electrode 13. In changing the distance of the contact 51, the resistance value can be increased by widening the distance of the contact 51, and the resistance value can be decreased by narrowing the distance of the contact 51.

Figure 18:
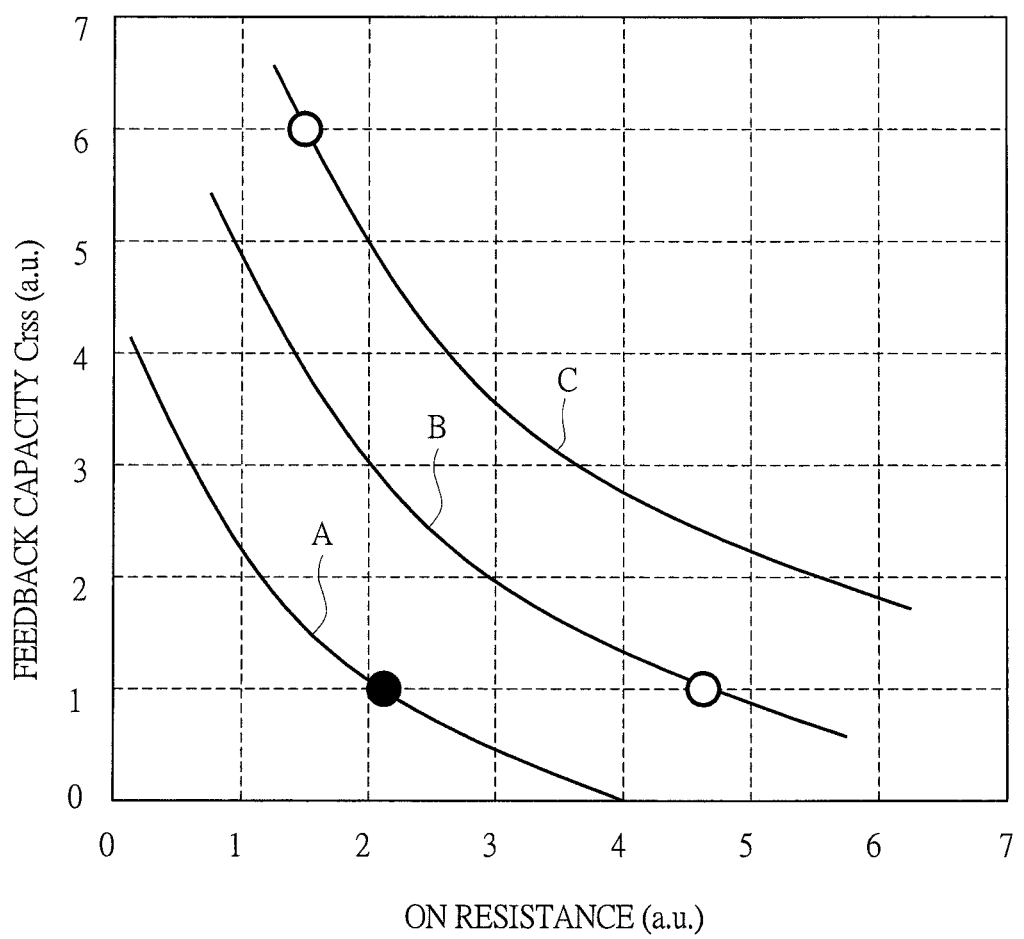
FIG. 18 is a diagram illustrating a trade-off relation between an ON resistance and a feedback capacity.

Next, FIG. 18 shows effects of the present invention in comparison of a trench MOSFET with a lateral-type MOSFET. FIG. 18 is a diagram in which the ON resistance "Ron" is shown on a horizontal axis and the feedback capacity "Crss" is shown on a vertical axis, and a reference symbol "A" corresponds to the semiconductor device according to the present embodiment, a reference symbol "B" corresponds to a conventional lateral-type MOSFET, and a reference symbol "C" corresponds to a conventional trench MOSFET, respectively. Circle marks show comparisons in the same chip area among the trench MOSFET, the lateral-type MOSFET, and the semiconductor device according to the present embodiment.

In the trench MOSFET, the ON resistance is small but the feedback capacity is large, and therefore, arbitrary characteristics in the trade-off curve between the ON resistance and the feedback capacity can be achieved by changing the chip area of the MOSFET. That is, characteristics (the ON resistance is small and the feedback capacity is large) shown at left above the diagram are obtained when the chip area is increased, and characteristics (the ON resistance is large and the feedback capacity is small) shown at right below the diagram are obtained when the chip area is decreased. When the lateral-type MOSFET is compared with the trench MOSFET in the same chip area, the ON resistance is larger but the feedback capacity is smaller, and therefore, the trade-off relationship is improved. However, in the lateral-type MOSFET, for achieving the same ON resistance as that of the trench MOSFET, it is required to increase the chip area of the lateral-type MOSFET to be about three times as large as that of the trench MOSFET, and therefore, this results in increasing the chip cost.

According to the present invention, in addition to the effects of the first embodiment, the ON resistance is increased to only about 30% higher than that of the trench MOSFET, and the trade-off relationship can be further improved than that of the lateral-type MOSFET. In this manner, the power MOSFET having the small feedback capacity and the small ON resistance can be achieved, and therefore, the present invention is effective for reducing the losses and cost of the power-supply device using the power MOSFET.

In the foregoing, the invention made by the inventors of the present invention has been concretely described based on the embodiments. However, it is needless to say that the present invention is not limited to the foregoing embodiments and various modifications and alterations can be made within the scope of the present invention.

A method of manufacturing a semiconductor device of the present invention is widely used for a power-supply device used for conversion of power supplied to a computer.

What is claimed is:
1. A semiconductor device including a power MOSFET, comprising:
  a semiconductor substrate of a first conductive type having a main surface and a rear surface;
  a first semiconductor region of the first conductive type formed above the main surface of the semiconductor substrate;
  a second semiconductor region of a second conductive type being opposite to the first conductive type formed in the first semiconductor region;
  a third semiconductor of the first conductive type formed in the first semiconductor region;
  a fourth semiconductor of the first conductive type formed in the second semiconductor region;
  a gate electrode of the power MOSFET formed over the second, third and fourth semiconductor regions;
  a source electrode of the power MOSFET electrically connected to the fourth semiconductor region;
  a drain electrode of the power MOSFET formed on the rear surface of the semiconductor substrate and electrically connected to the third semiconductor region;
  a first trench formed to reach the semiconductor substrate from a surface of the third semiconductor region; and
  a first conductive film embedded in the first trench via a first insulating film, wherein an impurity concentration of the semiconductor substrate is higher than impurity concentrations of the first and third semiconductor regions, respectively, wherein the impurity concentration of the third semiconductor region is higher than the impurity concentration of the first semiconductor region, and wherein the third semiconductor region is formed along the first trench so as to contact with the semiconductor substrate.

2. The semiconductor device according to claim 1, wherein a second trench is formed in the second semiconductor region, wherein a fifth semiconductor region of the second conductive type is formed in the second semiconductor region, is arranged at a bottom of the second trench and has a high impurity concentration than the second semiconductor region, and wherein the source electrode is formed in the second trench and is connected to the fourth and fifth semiconductor regions in the second trench.

3. The semiconductor device according to claim 1, wherein the first conductive type is an N type, and wherein the second conductive type is a P type.

4. The semiconductor device according to claim 1, wherein the first conductive film is electrically connected to the source electrode.

5. The semiconductor device according to claim 4, wherein the first conductive film includes polysilicon or tungsten.

6. The semiconductor device according to claim 5, wherein the first insulating film includes silicon dioxide or BST ((Ba, Sr)$TiO_3$).

* * * * *